United States Patent [19]

Scrutton et al.

[11] 4,389,473
[45] Jun. 21, 1983

[54] PRODUCTION OF TRANSFER MATERIAL

[75] Inventors: Simon L. Scrutton, London; William F. G. Marwick, Sittingbourne; David R. Wilson, Tadworth, all of England

[73] Assignee: Letraset USA, Inc., Bergenfield, N.J.

[21] Appl. No.: 203,265

[22] Filed: Nov. 3, 1980

Related U.S. Application Data

[60] Division of Ser. No. 959,145, Nov. 9, 1978, Pat. No. 4,254,211, which is a continuation-in-part of Ser. No. 794,988, May 9, 1977, abandoned, and Ser. No. 795,420, May 9, 1977, abandoned.

[30] Foreign Application Priority Data

May 7, 1976 [GB] United Kingdom ............ 18906/76

[51] Int. Cl.$^3$ .......................... G03C 5/00; G03C 1/90
[52] U.S. Cl. .................................. 430/17; 430/176; 430/258; 430/260; 430/270; 430/325; 430/329; 430/909
[58] Field of Search ................ 430/17, 258, 260, 252, 430/306, 325, 270, 909, 331, 329, 176

[56] References Cited

U.S. PATENT DOCUMENTS

| 1,917,294 | 10/1970 | Brendel | 340/163 |
|---|---|---|---|
| 2,760,863 | 8/1956 | Plambeck | 430/270 |
| 3,060,026 | 10/1962 | Neimat | 430/524 |
| 3,313,626 | 4/1967 | Whitney | 430/302 |
| 3,563,742 | 2/1971 | Philpot et al. | 430/270 |
| 3,765,894 | 10/1973 | Mellan | 430/526 |
| 3,785,817 | 1/1974 | Kuenta | 430/270 |
| 3,904,411 | 9/1975 | Erickson et al. | 430/258 |

FOREIGN PATENT DOCUMENTS

| 1917294 | 10/1970 | Fed. Rep. of Germany . |
|---|---|---|
| 1946726 | 4/1971 | Fed. Rep. of Germany . |
| 1017445 | 1/1966 | United Kingdom . |
| 1254475 | 11/1971 | United Kingdom . |
| 1291960 | 10/1972 | United Kingdom . |
| 1364627 | 8/1974 | United Kingdom . |
| 1403608 | 8/1975 | United Kingdom . |
| 1441982 | 7/1976 | United Kingdom . |

Primary Examiner—Richard L. Schilling
Attorney, Agent, or Firm—Darby & Darby

[57] ABSTRACT

Transfer material is prepared by applying to a substrate a layer of a photosensitive material which is insoluble but swellable in the solvent used to develop the image and whose adhesion to the substrate increases on exposure to light, imagewise exposing the material and developing the so-exposed material by treatment with a solvent fully to remove unexposed material from the substrate and, if necessary, treating the remaining areas of the exposed material to render them transferable from the substrate. In this manner the full thickness of the photosensitive material layer may be retained in the final transfer material. In particular, adhesive material may be applied to the layer photosensitive material before imagewise exposure, and the adhesive coated material imagewise exposed and developed to remove photosensitive material and adhesive in the non-exposed areas only to leave adhesive coated image indicia.

8 Claims, 1 Drawing Figure

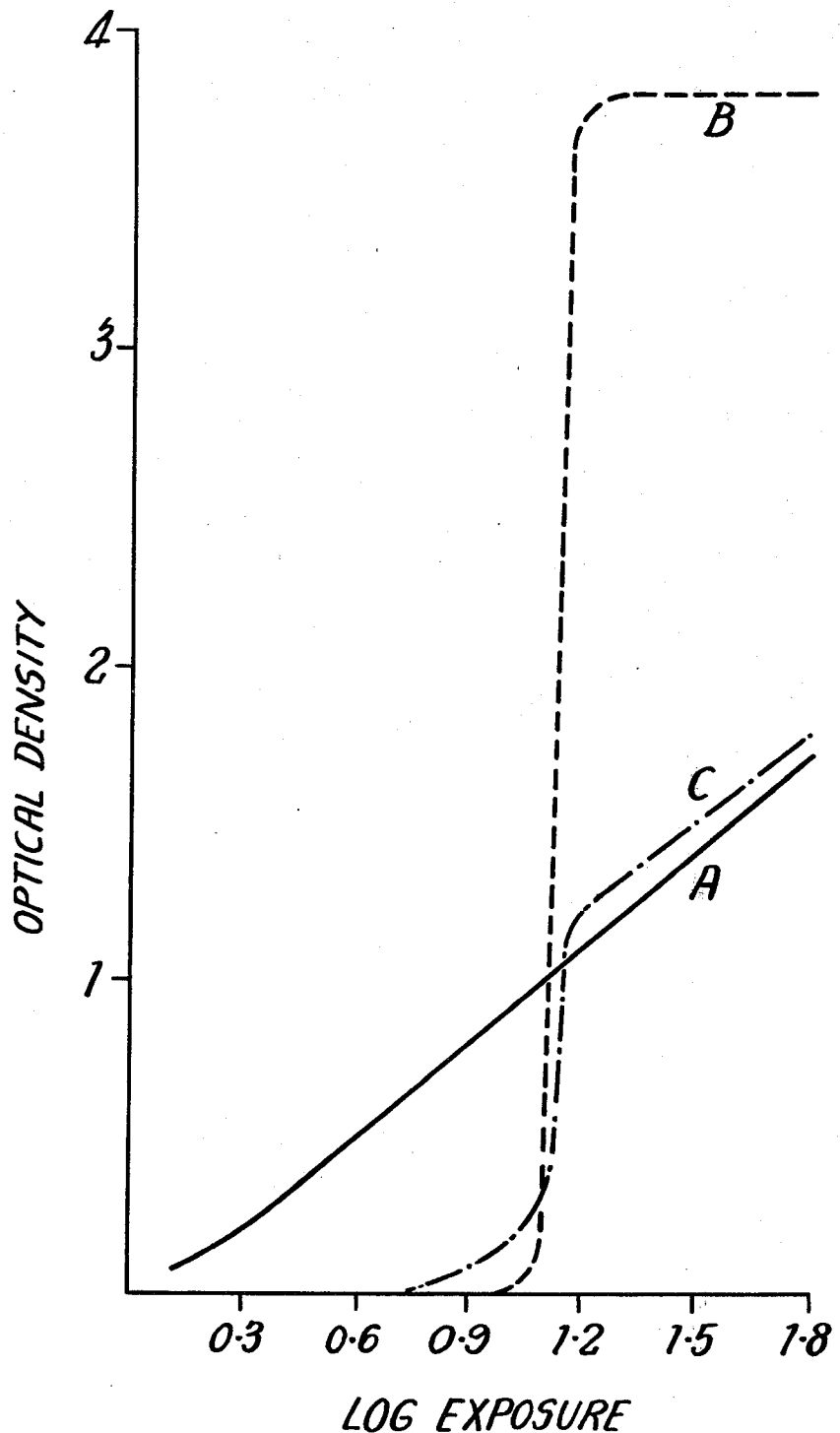

PRODUCTION OF TRANSFER MATERIAL

This is a division of application Ser. No. 959,145, filed Nov. 9, 1978, now U.S. Pat. No. 4,254,211, which is a continuation-in-part of applications Ser. No. 794,988, filed May 9, 1977, now abandoned, and Ser. No. 795,420, filed May 9, 1977, now abandoned.

FIELD OF THE INVENTION

This invention relates to the production of transfer materials.

Transfer materials are conventionally made by printing a design to be transferred on to a substrate from which it can subsequently be removed, for example by the action of a supercoated or superprinted adhesive. Production of such transfer materials accordingly necessitates the use of printing machinery and the production of an appropriate printing plate, cylinder, screen or the like. This requires high capital investment and is time consuming to effect and accordingly in recent years a number of proposals have been put forward for manufacturing transfer materials by methods including the steps of imagewise exposing photographically sensitised material and developing the so-exposed material to form coherent transferable images on a substrate.

DESCRIPTION OF THE PRIOR ART

It is known to produce images by the imagewise exposure of photographically sensitised material. Thus there is used a composite comprising a substrate and a layer of photographically sensitised material which material after imagewise exposure achieves differentiated properties in the exposed and non-exposed areas. The composite is imagewise exposed and, if necessary, subsequently treated so that the image and non-image areas achieve differentiated properties.

U.S. Pat. No. 3,060,026 to Heiart describes reproduction of images by thermal means. A photopolymerisable element comprising a base support bearing a photopolymerisable composition having in contact therewith a removable cover sheet (to protect the material from oxygen) is imagewise exposed. The photopolymerisable composition comprises a thermoplastic polymer and an ethylenically unsaturated compound such that on exposure through the cover sheet polymerisation of the unsaturated compound results in differential thermal stick temperatures between the exposed and non-exposed areas at the surface of the photopolymerisable composition. The protective cover sheet is then removed and the surface of the photopolymerisable composition brought into contact with an image-receptive element and the whole heated such that in the non-exposed areas surface material is transferred to the receptive element. In this process only surface material is transferred to the receptor and multiple copies can be obtained by repetition of the heat transfer process. The adhesion of the base support to the photopolymerisable material at their interface remains substantially unaffected by the exposure step. Fillers can only be used in the photopolymerisable layer if they are essentially transparent at the wavelength used for the exposure. Dyes or pigments, if required, are added after the thermal transfer. In this process there is no development step to give a visible differentiation between exposed and unexposed areas so accurate positioning of transferred material by visual alignment is not possible.

In particular it is known to produce images by the imagewise exposure of photopolymerisable material which after imagewise exposure becomes differentially soluble. Thus there is applied to a substrate a coating layer of photographically sensitised material which is soluble in a solvent used to develop an image obtained after imagewise exposure of the coating layer and which becomes insolubilised (hardened) on exposure to light and, if necessary, subsequent treatment. The composite material so formed is imagewise exposed and if necessary further treated selectively to insolubilise the coating layer in the exposed areas and then developed with a solvent to wash away the soluble material remaining in the non-exposed areas to leave the hardened material in the exposed areas.

U.S. Pat. No. 3,458,311 to Alles describes the production of printing plates using photopolymerisable elements comprising a support suitably with a hydrophilic surface, a photopolymerisable layer comprising an ethylenically unsaturated compound, a polymerisation initiator and a polymer binder, and an oxygen-impermeable but soluble protective layer (to protect the photopolymerisable layer from oxidation). The photopolymerisable element is imagewise exposed to harden the photopolymerisable layer in the exposed areas and then developed to wash out photopolymerisable material in the non-exposed areas to remove entirely the protective layer. The image thus obtained which adheres to its support is used as such without transfer e.g. as a printing plate.

It is further known to produce transfers using methods involving differential solubility. Thus British Patent Specification No. 1,079,661 to Alfaphote describes a process for the production of dry transfers for use in the production of silk screen stencils by imagewise exposing a transparent film carrying a sensitised layer of gelatin, immersing the film coated with gelatin in a hardening solution to harden gelatin in the exposed areas, washing away the unhardened gelatin from the non-exposed areas, drying and applying adhesive to the remaining indicia. Similarly British Patent Specification No. 1,364,627 to Visutronic describes the production of dry transfer materials by imagewise exposure of layers which are hardenable to harden the layers in the exposed areas, washing the unhardened material away to leave indicia which are then in a separate step coated with adhesive to render them transferable.

British Patent Specification No. 1,254,475 to Process Shizai describes the production of colour proofing materials using another such process. Here the support is provided with a photosensitive layer comprising a photosensitive substance of which the solubility selectively varies upon imagewise exposure and again the more soluble non-exposed areas are selectively removed to develop material. The remaining image may be transferred to a receiving member by use of an adhesive which may either be applied to the developed material or to the receiving member.

It is a disadvantage of such processes that the degree of hardening or insolubilisation will vary through the thickness of the photosensitive layer. It will be appreciated that in order fully to harden the entire photosensitive layer, the incident radiation must completely penetrate the full layer thickness. However, due to absorption and reflection within the layer, penetration of the radiation to areas remote from the surface on which the radiation is incident is not possible unless impractical (lengthy) exposure times are employed. This arises e.g.

from the fact that any pigment included in the layer will absorb or reflect the actinic radiation used to cause an imagewise change in the photosensitive material, as well as absorbing or reflecting light in the visible region intended. The pigment therefore prevents the actinic radiation from penetrating to the parts of the layer remote from the surface on which the imaging radiation is incident. Also for those systems where the actinic light absorbing sensitiser is not itself decomposed during irradiation to a species which does not absorb actinic light, a similar situation will occur, even when no pigment is present. That is that the sensitiser near the surface where the actinic light is incident will continue to absorb actinic light even after the necessary imagewise change in the coated composition has occurred near the light incident surface, and will thus prevent the actinic light from penetrating deeper into the layer and causing the desired change in that region.

Thus, in practice, a significant portion of the photosensitive layer in the areas exposed to actinic light will not be hardened. These unhardened areas will be removed with the non-exposed areas thereby resulting in a reduced layer thickness in the exposed areas. This in turn results in an image having inadequate optical density, particularly in the case of black lettering. While optical density may be increased by further lengthening the already substantial exposure period, this is impractical and also can lead to scattering of light which in turn produces undesirable opacity outside the image areas. These systems may be characterised by the curve shown as A in the FIGURE accompanying this specification wherein optical density is plotted against the logarithm of the exposure. The optical density or thickness of the developed image increases only slowly with the logarithm of the exposure. If the initial coated material has an optical density equivalent to that of a conventional screen printed dry transfer (e.g. 3.6–4.0), then an exposure of 25 seconds at 1 meter from a 2 kw Addalux mercury metal halide lamp will typically give an optical density of 1.0 after development. Similarly the coating thickness may be in the region of 15–20 microns, but after exposure and development the image will have a thickness of only about 5 microns. Increase in exposure will increase the opacity and thickness of the image to some extent, but in the example above would have to be increased to 2,000 seconds to produce an optical density of 3, and to 20,000 seconds to produce and optical density of 4. Apart from being impractical, such an exposure would also lead to scattered light producing an unwanted opacity outside image areas.

In addition, in connection with the production of dry transfer materials produced by photographic methods, the image indicia need to be adhesive on their top surface to enable them to be transferred to a receptor surface. One method, such as described in British Patent Specifications Nos. 1,079,661; 1,364,627; and 1,254,475 discussed above is to apply a layer of pressure sensitive adhesive to the sheets after the indicia have been exposed and developed. This method has the disadvantage that the adhesive is applied by a relatively slow, sheet-fed process at the final processing stage, when a customer may be waiting to take delivery of the order, and not, as is preferred, at the initial manufacturing stage, when relatively high-speed, web-fed coating equipment can be employed, and where there is not the same urgency to complete production of the product in a short timespan. The method has the further disadvantage that when indicia are transferred, stylus pressure outside image areas will cause some of the adhesive to transfer, hence giving adhesive contamination which will show up badly on transparent receptor surfaces, and which, on all surfaces, will retain dust and dirt.

British Patent Specification No. 1,291,960 to Ozalid describes another method in which the adhesive is coated as the middle layer in a three layer system, and the developed image used as a mask for a solvent washout of the adhesive layer and underlying pigment layer, the developed images being subsequently removed to expose the adhesive coated indicia. This method has firstly the disadvantage that three coated layers are required in place of two, secondly that different solvents, and hence extra processing steps, are required to develop the different layers, and thirdly that solvent undercutting of the image makes the processing so critical that it is difficult to obtain a consistent product.

Yet another method is to add an adhesive component to the photosensitive polymer layer itself, so that the image after development is tacky enough to transfer to a receptor surface. With this method steps must be taken to ensure that after transfer the image does not still have a tacky top surface. This can be achieved by coating the tacky photosensitive polymer layer onto a non-tacky release layer, which is itself coated on the substrate. On transfer the release layer shears and is transferred with the image to give a tack-free top surface, but the method has the disadvantage that the release layer is also found to transfer where stylus pressure has been applied outside image areas, and hence to give bad contamination on transparent receptor surfaces.

An alternative method of providing a tack-free surface to an adhesive-containing image after transfer, and one which gives no contamination outside image areas, is to coat two photosensitive polymer layers one on top of the other, the first layer having no adhesive component, and the second layer containing an adhesive component. Exposure and development give images having a tack-free surface next to the substrate, and a tacky surface furthest from the substrate, but this method has the disadvantages first that if, as is preferred, the same photosensitive system is used for both layers, the first layer will be disturbed by the coating of the second layer, since the same solvent is used, and hence will not behave in a consistent manner, and secondly it is difficult to obtain a high degree of control over the tack of the second layer, while still retaining adequate sensitivity to light and good development characteristics.

DESCRIPTION OF THE INVENTION

According to the present invention there is provided a method of preparing a transfer material which comprises applying to a transparent or translucent substrate a coating layer of material which is insoluble but swellable in solvent used to develop an image created by imagewise exposure of the coating layer and whose adhesion to the substrate increases on exposure to light;

imagewise exposing the composite material so formed to increase the adhesion of the coating layer to the substrate in the exposed areas, and developing the imagewise exposed material with the solvent to remove those parts of the coating layer which have not been exposed, and, if necessary, treating the remaining areas of the coating to render them transferable from the substrate.

In the present method there are required only short exposure times to obtain, after exposure and development, sharp image indicia having high opacity and of substantially the same thickness as the coating layer of the original composite. The coating material in the exposed parts remains substantially intact during development and those unexposed parts are fully removed during the development. With the present method the adhesion of the image indicia to the substrate can be changed by making small formulation changes in the coating layer and thus, although a release layer, i.e. a layer between substrate and image-forming layer promoting separation, may be used, it is seldom necessary.

The material of the photosensitive coating layer is insoluble but swellable in the solvent used to develop the image and its adhesion to the substrate increases on exposure to light. Thus this material contrasts with the starting material used in the prior art which is relatively soluble and is insolubilised after exposure to light and relies on the resulting differential solubility for removal of the non-exposed areas.

It has surprisingly been found that, with the use of a photosensitive coating layer according to the present invention, substantially the full layer thickness, and hence opacity, is retained in image areas on development while zero layer thickness or opacity is obtained in the non-image areas where the coating is fully removed by the developer. Provided that a certain (low) minimum exposure is exceeded, the optical density of the transfer material obtained is substantially independent of exposure. Using the present materials, the optical density or image thickness increases very rapidly over a small exposure range. These characteristics are shown by curve B of the FIGURE accompanying this specification, which is a characteristic curve for materials according to the present invention. Materials having this type of characteristic curve have the further considerable advantage that low exposures, such as are given by scattered light, give no opacity until close to the exposure required to retain the full film thickness. Hence sharp, high opacity images may be obtained.

The mechanism of the present invention is not fully understood but measurements show that there is an increase in adhesion between the photosensitive coating layer and the substrate on exposure to light, hence photoadhesion is clearly present. Further an increase in contact angle with exposure on the surface next to the substrate, and hence a differential exclusion of water from the substrate-photosensitive layer interface during development may occur. It is believed that on exposure of the composite material according to the present invention through the substrate in the exposed areas there is a change from hydrophilic to hydrophobic in the material of the photosensitive coating layer at its interface with the substrate possibly as a result of removal of the photosensitive, e.g. diazo, groups adjacent the surface. Thus the process relies only on a change at the interface of the substrate and photosensitive material in contrast to the prior art methods which rely on penetration of incident radiation into the body of the photosensitive material to insolubilise the material of the layer.

On development, as a result of the photoadhesion, the coating material remains firmly adherent to the substrate in the exposed areas and is not released by the developer. In the non-exposed areas however the coating material is fully removed. Here, it is believed, the developer causes reticulation and swelling to release the layer material entirely from the substrate.

The composition of the photosensitive coating used according to the present invention will of course depend on the developer to be used. The nature and proportions of the components of the coating must however of course be chosen so as to ensure the properties specified above. The most convenient developer to use is water and thus the photosensitive coating layer should be insoluble but swellable in water. Diazoresin sensitized polyvinyl alcohol/acetate is an appropriate photosensitive system. However, instead of using the system as it is normally used in stencil materials, in a form where the unexposed material is soluble in water, the ratio of polyvinyl acetate or polyvinyl acetate copolymer component to the polyvinyl alcohol is increased so that the unexposed coating is insoluble in water. Unexpectedly it is found that the unexposed material can still be washed away from the substrate, but the exposed material remains firmly in place on the substrate. The ratio of alcohol to acetate copolymer depends on the precise alcohol and copolymer used. In practice, if a range of formulations are made up with different alcohol to acetate copolymer ratios, those with high alcohol content will tend to behave like curve A of the accompanying FIGURE while those with high acetate copolymer content will tend to behave like curve B. Intermediate transitional behaviour is observed to be either a mottled image, where part of the full film thickness is retained, but part is washed away to leave a lower film thickness, as expected from curve A, or alternatively the intermediate behaviour may be demonstrated by an immediate optical density-log exposure curve similar to C in the accompanying FIGURE. Only when the polyvinyl acetate to polyvinyl alcohol copolymer ratio is high enough to achieve the type of behaviour represented by curve B can the benefits of the invention be fully realised. Intermediate behaviour, as represented by curve C, will only partially realise the benefits of the invention. Not all polyvinyl acetate copolymers have the correct solubility characteristics to enable a curve similar to B to be obtained even at high polyvinyl acetate copolymer to polyvinyl alcohol ratios.

Other photosensitive systems may also be used. For example there may be used as sensitiser, a bisazido compound or a carbonyl compound which acts as a free radical source together with a monomer having one or more carbon-carbon double bonds e.g. an acrylic monomer. In addition other polymer components e.g. polyvinyl pyrrolidone/polyvinyl acetate may be used.

Strength and flexibility of the final image, and ease of release from the substrate can be varied by the use of plasticisers. These can be conventional external plasticisers such as tributylphosphate or, as is preferred, internal plasticisers in the form of polyvinyl acetate copolymers.

The indicia formed on development may be opaque and coloured black, white or a spectral colour by incorporation of the appropriate pigment or dye. The indicia formed may also be transparent or translucent, but unless also coloured by a transparent or translucent dye or pigment will retain only the advantage over the prior art that they increase thickness without the necessity for using increased exposure times.

The substrate used according to the present invention may be a film or foil of transparent or translucent plastics material of various types, or it may be a laminate having a surface of one of these types of plastics material. Specific substrate materials included polyethylene, polyesters, e.g. polyethylene terephthalate, polystyrene, polypropylene, triacetate and transparent papers, all with or without a release coat.

If necessary the remaining image areas of the coating are treated to render them transferable from the substrate. Such treatment may consist for example in supercoating the remaining image areas with an adhesive which is capable of pulling those areas from the substrate when the adhesive is adhered to a receptor surface on to which it is desired to transfer the image. Alternatively or additionally, use may be made of the technique described in British Patent Specification No. 959,670 to Letraset to secure release of the remaining areas from the substrate in order that they may be transferred on to a receptor surface. The image areas on the substrate may themselves be of a sufficiently adhesive nature on their side remote from the substrate to avoid the necessity of applying a further coating of adhesive.

According to a particularly preferred embodiment of the present invention the adhesive is applied to the photosensitive layer prior to the imagewise exposure step. According to this preferred embodiment there is provided a method of preparing a dry transfer material which comprises applying to a transparent or translucent substrate a first layer of material which is insoluble but swellable in a solvent used to develop an image in the material and whose adhesion to the substrate increases on exposure to light;

applying over the first layer a second layer of adhesive material which is permeable to but insoluble in the solvent used to develop the image;

imagewise exposing the composite material so formed to increase the adhesion of the first layer to the substrate in the areas exposed to light; and developing the imagewise exposed material with a solvent fully to remove the first and second layers in the unexposed areas.

This is made possible according to the present invention because, as explained above, the original full layer thickness of the photosensitive material is retained in the exposed areas after development and thus the adhesive material in contact therewith remains to give adhesive-coated indicia. This contrasts with the prior art methods relying on photoinsolubilisation wherein the incomplete insolubilisation, as in practice inevitably occurs, means that some of the layer thickness in the exposed areas is removed and thus any overlying adhesive present would be removed as well. Thus according to such prior art procedures the adhesive layer is applied after development with the resulting disadvantages.

According to this preferred embodiment there are required only short exposure times to obtain in the exposed image areas adhesive coated indicia which are sharp images, have high opacity and are of substantially the same thickness as in the original composite material. Further the images can have a good, and well controlled tack, so that they transfer easily to receptor surfaces without contamination of the non-image areas, either by adhesive or by release layer. Moreover the present method requires only one process step after the imagewise exposure. This offers the possibility of custom-made dry transfer sheets being produced at short notice, theoretically even while a customer waits in a store.

The exposed image areas of the materials obtained according to this preferred embodiment, which form the adhesive coated indicia, may be transferred from the substrate to adhere, by means of their adhesive coating, to a receptor surface. Additionally, use may be made of the technique described in the above-mentioned British Patent Specification No. 959,670 to secure release from the substrate.

The second (adhesive) layer must be permeable to but insoluble in the solvent used to develop the image. This can be achieved by making the second (adhesive) layer appropriately fracturable i.e. having low cohesive strength such that it can be readily sheared. It will be observed that after exposure and development there is no adhesive on the substrate in the areas between the indicia and that a usable dry transfer material is accordingly automatically produced using only one processing step on the sensitised material apart from the imagewise exposure.

In order to facilitate the manufacture of the base stock material the first (photosensitive) layer is preferably laid down from a water based solution or dispersion while the adhesive containing layer should be laid down from a solution or dispersion in such a manner or by the use of such a formulation e.g. based on a water-immiscible organic solvent so that the first layer is undisturbed.

Adhesives suitable with this system can be formulated from the wide range of materials available for pressure sensitive adhesives e.g. polyvinyl ethyl ether, poly-vinyl isobutyl ether, poly-isobutylene, polymers of various acrylic acid esters, tackified rubber and ethylene vinyl acetate. These can be modified by the use of resins and particularly silica which is found to improve water permeability. Other materials which improve water permeability may also be added e.g. wetting aids and water-soluble resins like polyvinyl methyl ether.

The invention is further described with reference to the following non-limitative Examples.

EXAMPLE 1

A photosensitive polymer material of the following formulation is prepared:

Premix
30 g. Moviol 4-88
210 g. Water
30 g. Vulcan 3 Fluffy

Formula
40 g. Premix
50 g. 12.5% aqueous solution of Moviol 4-88
50 g. Mowilith DHL
50 g. Vinamul 6825
50 g. 5% aqueous solution of ZAL diazo resin Moviol is a trade name for a range of polyvinyl alcohols manufactured by the Harlow Chemical Company. Vulcan 3 Fluffy is a carbon black pigment manufactured by Cabot Carbon Ltd. Monwilith DHL is a polyvinyl acetate homopolymer supplied by the Harlow Chemical Company as a 50% solids dispersion in water. Vinamul 6825 is a polyvinyl acetate/acrylate copolymer supplied by Vinyl Products as a 56% solids dispersion in water. ZAL diazo resin is supplied by Associated British Maltsters as the zinc chloride double salt of a condensation product of 4-diazodiphenylamine with formaldehyde.

Procedure 30 g Moviol 4-88 are ball milled with 30 g. of Vulcan 3 Fluffy in 210 g. water. When the dispersion has a reading of 7 on a Hegman gauge (approximately 20 hours), 40 g. of the dispersion are added to 50 g. of a stirred 12.5% solution of Moviol 4-88.

After 15 minutes the resulting dispersion is added slowly to a stirred mixture of 50 g. of Mowilith DHL and 50 g. of Vinamul 6825. Following completion of the addition, stirring is continued for a further period of 30 minutes, and the mixture is then sensitised by the addition of 50 g. of a 5% solution of ZAL diazo resin in water.

The final dispersion is filtered through a 95S mesh to remove any lumps, and left overnight before coating with a No. 36 wire wound Meyer bar (wire diameter 900 microns) onto sheets of 0.1 mm thick untreated high density polyethylene.

After drying in a current of air at ambient temperature, the coating is exposed through the polyethylene support in contact with a photographic negative to light from a 2 kw Addalux lamp at a distance of 100 cm for a period of 30 seconds. The images are then developed by a spray of cold tap water from a bathroom spray fitting, to leave a clean relief image remaining on the support. A range of exposures will yield an optical density-log exposure curve similar to B in the accompanying FIGURE.

The material is then dried in a current of warm air at 40° C. and coated with a thin layer of a conventional pressure-sensitive adhesive based on polyisobutylene. After drying the sheets can be rubbed on the back with a stylus to release the indicia from the polyethylene carrier sheet, and the adhesive is then of sufficient power to pull the so-released indicia from the carrier sheet and leave them adhered to the desired receptor surface.

If the formula is adjusted from that shown above so that there is 200 g. of 12.5% Moviol 4-88 instead of 50 g., and 25 g. each of Mowilith DHL and Vinamul 6825 instead of 50 g., then the optical density-log exposure curve will no longer be similar to curve B in the accompanying FIGURE, but will be similar to curve A.

EXAMPLE 2

Formula
 20 g. Premix
 70 g. 12.5% aqueous solution of Moviol 40-88
 50 g. Mowilith DHL
 50 g. Vinamul 6825
 50 g. 5% aqueous solution of ZAL diazo resin The procedure is as for Example 1, using in the coating layer preparation the above formulation.

The resulting dry transfer sheets behave in a similar way to those of Example 1, and give an optical density-log exposure curve similar to curve B in the accompanying FIGURE.

EXAMPLE 3

Formula
 13 g. Premix
 15 g. 12.5% aqueous solution of Moviol 4-88
 30 g. Mowilith DHL
 1 g. Tri-butyl phosphate
 15 g. Vinamul 6825
 15 g. 5% aqueous solution of ZAL diazo resin The procedure is as for Example 1 using in the coating layer preparation the above formulation. The tri-butyl phosphate plasticizer is added to the mixture of Mowilith DHL and Vinamul 6825 before adding the solution of Moviol 4-88 with dispersed premix. The resulting dry transfer sheets behave in a similar way to those of Example 1, and give an optical density-log exposure curve similar to curve B in the accompanying FIGURE.

EXAMPLE 4

Formula
 13 g. Premix
 15 g. 12.5% aqueous solution of Moviol 4-88
 30 g. Mowilith DHL
 1 g. Acetyl tri-isobutyl citrate
 15 g. Vinamul 6825
 15 g. 5% aqueous solution of ZAL diazo resin The procedure is as in Example 3 using in the coating layer preparation the above formulation. The resulting dry transfer sheets behave in a similar way to those of Example 1, and give an optical density-log exposure curve similar to curve B in the accompanying FIGURE.

EXAMPLE 5

Formula
 45 g. Premix
 40 g. 12.5% aqueous solution of Moviol 4-88
 50 g. Vinamul 9900
 50 g. Vinamul 6525
 50 g. 5% aqueous solution of ZAL diazo resin Vinamul 9900 is a polyvinyl acetate homopolymer supplied by Vinyl Products as a 50% solids dispersion in water. Vinamul 6525 is a polyvinyl acetate/caprate copolymer supplied by Vinyl Products as a 56% solids dispersion in water.

The procedure is as in Example 1 using in the coating layer preparation the above formulation. The resulting dry transfer sheets behave in a similar way to those of Example 1, and give an optical denisty-log exposure curve similar to curve B in the accompanying FIGURE. If the formulation is changed from that shown above to 150 g. 12.5% Moviol 4-88 instead of 40 g., and 35 g. each of Vinamul 9900 and Vinamul 6525 instead of 50 g., the optical density-log exposure curve will not longer be similar to curve B in the accompanying FIGURE, but will be similar to curve A.

EXAMPLE 6

Formula
 45 g. Premix
 55 g. 12.5% aqueous solution of Moviol 4-88
 30 g. Emultex VV 530
 50 g. Mowilith DHL
 20 g. Vinamul 6525
 55 g. 5% aqueous solution of ZAL diazo resin Emultex VV 530 is a polyvinyl acetate/vinyl ester of versatic acid copolymer supplied by the Harlow Chemical Company as 52.5% solids dispersion in water.

The procedure is as in Example 1 using the above formulation except that there are now three polyvinyl acetate copolymers to mix together in place of the two in Example 1. The resulting dry transfer sheets behave in a similar way to those of Example 1, and give an optical density-log exposure curve similar to curve B in the accompanying FIGURE.

EXAMPLE 7

A release layer on high-density untreated polyethylene (4 thou) is prepared by coating the polyethylene with the following formulation using a No. 5 Meyer Bar (wire diameter 125 microns).
 85 g. Elvamide 8063
 100 g. 2-ethoxyethanol 300 g. Methanol Elvamide 8063 is a polyamide resin supplied by DuPont.

The polyethylene with release layer is used to support the following photopolymer formulation.

40.5 g. Premix
48 g. 12.5% aqueous solution of Moviol 4-88
52.5 g. Vinamul 9900
48 g. Vinamul 6825
51 g. 5% aqueous solution of ZAL diazo resin The procedure is as in Example 1. The resulting dry transfer sheets behave in a similar way to those of Example 1, and give an optical density-log exposure curve similar to curve B in the accompanying FIGURE.

EXAMPLE 8

A release layer on high-density untreated polyethylene (4 thou) is prepared by coating the polyethylene with the following formulation using a No. 5 Meyer Bar (wire diameter 125 microns).

50 g. Ultramid 1C
200 g. 2-ethoxyethanol
800 g. Methanol

Ultramid 1C is a polyamide resin supplied by B.A.S.F.

The polyethylene with release layer is used to support the photopolymer formulation described in Example 7. The resulting dry transfer sheets behave in a similar way to those of Example 1, and give an optical density-log exposure curve similar to curve B in the accompanying FIGURE.

EXAMPLE 9

A release layer on polyethylene terephthalate film (Melinex) is prepared by coating the polyethylene terephthalate with the following formulation using a No. 5 Meyer Bar (wire diameter 125 microns).

5 g. ACP6
12 g. Aromasol H
83 g. Toluene

ACP6 is a polyethylene wax supplied by Allied Chemicals. Aromasol H is an aromatic hydrocarbon solvent supplied by ICI.

The polyethylene terephthalate with release layer is used to support the photopolymer formulation described in Example 6. The resulting dry transfer sheets behave in a similar way to those of Example 1, and give an optical density-log exposure curve similar to curve B in the accompanying FIGURE.

EXAMPLE 10

Formula
85 g. 12.5% aqueous solution of Moviol 4-88
50 g. Vinamul 9900
50 g. Vinamul 6525
50 g. 5% aqueous solution of ZAL diazo resin The 85 g. of Moviol 4-88 solution are added slowly to a stirred mixture of 50 g. Vinamul 9900 and 50 g. Vinamul 6525. Following completion of the addition stirring is continued for a further period of 30 minutes, and the mixture is then sensitised by the addition of 50 g. of a 5% solution of ZAL diazo resin in water. The mixture is left overnight before coating with a No. 36 wire wound Meyer bar (wire diameter 900 microns) onto sheets of untreated high-density polyethylene 0.1 mm thick.

After drying in a current of air at ambient temperature, the coating is exposed as in Example 1. The resulting dry transfer images are transparent, since no pigment has been included in the formulation, but an image thickness-log exposure curve has the same shape as curve B in the accomanying FIGURE.

EXAMPLE 11

A photosensitive polymer material of the following formulation is prepared:

Formula
45 g. Premix
55 g. 12.5% aqueous solution of Moviol 4-88
30 g. Emultex VV 530
50 g. Mowilith DHL
20 g. Vinamul 6525
55 g. 5% aqueous solution of ZAL diazo resin Procedure 45 g. of the Premix are added to 55 g. of a stirred 12.5% aqueous solution of Moviol 4-88. After 15 minutes the resulting dispersion is added slowly to a stirred mixture of 30 g. Emultex VV 530, 50 g. Mowilith DHL and 20 g. Vinamul 6525. Following completion of the addition, stirring is continued for a further period of 30 minutes, and the mixture is then sensitised by the addition of 55 g. of a 5% solution of ZAL diazo resin in water.

The final dispersion is filtered through a 95S mesh to remove any lumps, and left overnight before coating with a No. 36 wire wound Meyer bar (wire diameter 900 micron) onto high-density, untreated polyethylene (0.1 mm). The sheet is dried in a current of air at ambient temperature.

An adhesive is prepared using the following formulation:

170 g. Aromasol H
320 g. 50% solution of Piccolyte α-125 in Aromasol H
1 g. Produkt 963
570 g. EHBC
160 g. EHBM
160 g. Aerosil 300
2760 g. CAS 20/2

Piccolyte α-125 is a terpene resin supplied by Pennsylvania Industrial Chemical Corporation. Produkt 963 is a wetting agent supplied by Henkel Ltd. EHBC and EHBM are polyvinyl ethyl ethers supplied by Bakelite Xylonite Ltd. Aerosil 300 is silica supplied by Degussa. CAS 20/2 is an aliphatic hydrocarbon supplied by Carless Capel and Leonard Ltd.

The Aromasol H, the Piccolyte α-125 and the Produkt 963 are mixed together by hand, and followed by the addition of EHBC, EHBM and Aerosil 300 using a stirrer. The mix is milled on a triple roller mill until homogeneous, CAS 20/2 solvent stirred in slowly, and the whole adhesive then thoroughly dispersed with a Silverson mixer.

The adhesive is coated onto the photosensitive polymer layer using a No. 10 Meyer bar (wire diameter 250 microns) and dried at 30° C.

The composite so obtained is exposed through the polyethylene support in contact with a photographic negative to light from a 2 kw Addalux lamp at a distance of 100 cm for a period of 30 seconds. The images are developed by a spray of cold tap water from a bathroom spray fitting, to leave a clean relief image remaining on the support. The image is found to have adhesive on its top surface, and there is no adhesive on areas of the support between images.

After drying the sheets can be rubbed on the back with a stylus to give pre-release of the indicia from the polyethylene carrier sheet, and the adhesive is then of sufficient power to pull the released indicia from the carrier sheet and leave them adhered to the desired receptor surface.

EXAMPLE 12

A base sheet is prepared by coating onto 75 micron polyethylene terephthalate film a release coat composed of 5% polyethylene wax (softening point 106° C.) in toluene. Low coating weights are to be preferred, application using a No. 5 wire wound bar gives a coating of required thickness.

After removal of the solvent by a warm air blast a photosensitive layer of the formulation given below is coated on to the base sheet with a No. 25 Meyer bar and dried with air at ambient temperature.

| Pigment Dispersion (parts by weight) | |
| --- | --- |
| Carbon black pigment | 20 |
| 12½% solution of Moviol 8.88 | 80 |

The above is triple roll milled to a Hegman gauge reading of 7+.

| Photosensitive Layer (parts by weight) | |
| --- | --- |
| Pigment dispersion | 10 |
| Vinnapas D50G | 50 |
| Vinnapas 50/5VL | 20 |
| 5% Aqueous ZAL solution | 10 |
| Water | 6 |

To the dried photosensitive layer is then applied an adhesive layer comprising (parts by weight):

| Lutanol J60 | 1.0 |
| --- | --- |
| Lutanol J30 | 6.5 |
| Stabelite ester 10 | 2.0 |
| Silica | 2.0 |
| Aliphatic Hydrocarbon solvent | 80.0 |

Vinnapas D50G and Vinnapas 50/5VL are polyvinyl acetate homopolymer and polyvinyl acetate copolymer supplied by Wacker Chemie GmbH. Lutanol J60 and Lutanol J30 are polyvinyl isobutyl ethers supplied by B.A.S.F. Stabelite ester 10 is a glycerol ester of hydrogenated rosin supplied by Hercules.

The materials are stirred together with a high shear stirrer with only half of the total solvent content, the remainder is added slowly after dispersion of the silica is certain.

The coating and exposure details are as for the adhesive in Example 11.

EXAMPLE 13

A photosensitive sheet is prepared as in Example 11 or 12 and coated with an adhesive with the formulation (parts by weight):

| Oppanol B50 20% NV in Aliphatic hydrocarbon | 12.5 |
| --- | --- |
| Oppanol B3 | 6.0 |
| Silica | 1.5 |
| Oxitol | 1.5 |
| Aliphatic hydrocarbon solvent | 68.0 |

Oppanol B50 and Oppanol B3 are polyisobutylene resins supplied by B.A.S.F.

After drying the composite obtained it is exposed and developed as in Example 11.

EXAMPLE 14

A photosensitive sheet is prepared as in Example 12 and coated with adhesive layer comprising of:

| Gelva RA788 | 17.0 parts by weight |
| --- | --- |
| Aerosil 300 | 3.0 parts by weight |
| White Spirit | 80.0 parts by weight |

Gelva RA788 is a tacky acrylic polymer supplied by Monsanto.

The ingredients were stirred to disperse the silica.

Development and exposure details are as in Example 11.

EXAMPLE 15

The following ingredients are mixed using a high shear Silverson mixer to give a carbon black dispersion (parts by weight):

| Elftex | 125 |
| --- | --- |
| 20% solution of K90 in methanol | 180 |
| Methanol | 195 |

Elftex 150 is a carbon black made by Cabot Carbon. K90 is a polyvinyl pyrrolidone made by B.A.S.F.

Then the following materials are mixed to give a photosensitive composition (parts by weight):

| Carbon black dispersion | 25 |
| --- | --- |
| 20% solution of K90 in methanol | 60 |
| 5% 4,4'-diazidostilbene-2,2'-disulphonic acid disodium salt in water | 9 |
| Glascol HA4 | 48 |
| 30% Vinac B25 in methanol | 40 |

Glascol HA4 is an acrylic copolymer solution made by Allied Colloids. Vinac B25 is a polyvinylacetate made by Air Products Ltd.

Polyethylene terephthalate (542 Melinex) is coated, using a bar wound with 380 microns diameter wire, with a release coat made by mixing the following components (parts by weight):

| Pliolite S5B | 9 |
| --- | --- |
| Gasil 644 | 2 |
| Paraffin wax 52/54° C. m.p. | 1 |
| Toluene | 88 |

Pliolite S5B is a styrene butadiene copolymer of Goodyear Chem. Gasil 644 is a silica of Crossfield.

The photosensitive composition is coated over the release layer using a bar wound with 380 microns diameter wire. The dried photosensitive composition is then coated with an adhesive made up as described in Example 11 except that 50% extra silica is included.

The composite so obtained is exposed to light from a 2.5 kw mercury halide lamp through a transparency placed in contact with the Melinex for 100 seconds. The image is developed by washing out with water and then dried to give a transferable self adhesive image.

EXAMPLE 16

The following initiator premix is made up (parts by weight):

| 20% Quantacure 597 in acetone | 30 |
|---|---|
| Quantacure 653 | 10 |
| Span 80 | 1 |
| Tween 80 | 2 |

Quantacure 597 is 2-isopropylthioxanthone made by Ward Blenkinsop. Quantacure 659 is 13% w/w 2-isopropylthioxanthone in 2-(dimethylamino)ethyl benzoate made by Ward Blenkinsop. Span 80 and Tween 80 are surfactants of Honeywill Atlas.

The following materials are mixed together (parts by weight):

| 30% Gohsenol GL03 | 145 |
|---|---|
| Dispersion of 25% Elflex 150 in 12% Moviol 8-88 | 75 |
| Methylene bis acrylamide | 4.8 |
| Bevaloid 6464 | 30 |
| Mowilith DHL | 1060 |
| Vinnapas MV70H | 200 |

Gohsenol GLO3 is a polyvinyl alcohol made by Nippon Gohsei. Moviol 8-88 is a polyvinyl alcohol made by Harlow Chemical Company. Bevaloid 6464 is a reactive acrylic copolymer containing glycidyl methacrylate groups ex Bevaloid Ltd. Vinnapas MV70H is a polyvinyl acetate copolymer emulsion made by Wacker Chemie.

To this latter mixture are added with high shear stirring (parts by weight):

| Saturated solution of hexachloroethane in dioxane | 60 |
|---|---|
| Initiator premix | 30 |

The resulting formulation is coated onto 100 micron thick polyethylene using a bar wound with 500 micron diameter wire and allowed to dry at 45° C. An adhesive made up as described in Example 11 is then applied over the photosensitive composition using a bar wound with wire at 250 microns diameter.

The dried material is then exposed to light from a 2.5 kw mercury metal halide lamp at 1 m distance through a negative placed in contact with the polyethylene for 100 seconds. After spray washing with water and drying, a sheet of self adhesive dry transfers is obtained.

EXAMPLE 17

Biaxially orientated high impact polystyrene (BOHIPS) coated with a silicone release coat and known as AVP polypaper M7 clear made by AVP Extrustions Ltd. is coated with a photosensitive layer as described in Example 12 in the manner described in Example 12. After drying the photosensitive layer is overcoated with an adhesive as described in Example 11 in the manner described in Example 11.

The material obtained is exposed to light from a 2.5 kw mercury metal halide lamp through a negative placed in contact with the release coated BOHIPS for 20 seconds and finally washed out with water. The resulting sheet when dry supports self adhesive transferable images.

EXAMPLE 18

Polystyrene sheet is coated with the release coat as described in Example 15, a photosensitive layer and an adhesive layer as described in Example 17.

The composite obtained is exposed, washed out and dried to give a sheet of dry transfers.

We claim:

1. The transfer material obtained by applying to a transparent or translucent substrate a coating layer which comprises a photosensitized composition of a homopolymer or copolymer of vinylacetate with polyvinyl alcohol or polyvinyl pyrrolidone the coating layer being insoluble but swellable in water and the ratio of said acetate constituent of the layer to said alcohol or pyrrolidone constituent of the layer being sufficiently high to render the layer insoluble in water prior to exposure and the adhesion of the coating layer to the substrate increasing on exposure to actinic light, imagewise exposing the coating layer to actinic light through the substrate to increase the adhesion of the coating layer to the substrate in the exposed areas, and developing the imagewise exposed coating layer by applying water to the coating layer to wash away those parts of the coating layer which have not been exposed and to retain substantially the original thickness of the coating layer in the areas which have been exposed.

2. Transfer material according to claim 1, wherein the coating layer comprises diazo-resin sensitised polyvinyl alcohol/vinyl acetate homopolymer or copolymer.

3. Transfer material according to claim 1, wherein adhesive is printed on to the remaining areas of the coating to render them transferable from the substrate.

4. The dry transfer material obtained by applying to a transparent or translucent substrate a first layer which comprises a photosensitized organic polymeric composition which is insoluble but swellable in an aqueous fluid used to develop an image in said layer after imagewise exposure to light and the adhesion of the layer to the substrate increasing on exposure to actinic light, said composition comprising a homopolymer or copolymer of vinylacetate with a member selected from the group consisting of polyvinylalcohol and polyvinylpyrrolidone wherein the ratio of the acetate constituent to the alcohol or pyrrolidone constituent is sufficiently high to render the layer insoluble in said aqueous fluid, applying over the first layer a second layer of adhesive material which is permeable to but insoluble in the aqueous fluid used to develop the image, imagewise exposing the first and second layer through the substrate to increase the adhesion of the first layer to the substrate in the areas exposed to light, and contacting the imagewise exposed layers with the aqueous fluid to fully remove the first and second layers in the unexposed areas and to leave the first and second layers in place in those areas which have been exposed.

5. Dry transfer material according to claim 4, wherein the first layer is applied from a water-based solution or dispersion and the second layer is applied from a solution or dispersion in a water-immiscible organic solvent.

6. Dry transfer material according to claim 4, wherein the second layer is of a polyvinyl ethyl ether, polyvinyl isobutyl ether, poly-isobutylene, acrylic acid ester polymer, tackified rubber or ethylene vinyl acetate adhesive.

7. Dry transfer material according to claim 4, wherein the first layer is of diazo-resin sensitised polyvinyl alcohol/vinyl acetate homopolymer or copolymer.

8. The transfer material of claim 1 wherein the areas of the coating material remaining on the substrate are treated, to render them transferable from the substrate.

* * * * *